United States Patent [19]
Atsumi et al.

[11] Patent Number: 5,568,419
[45] Date of Patent: Oct. 22, 1996

[54] NON-VOLATILE SEMICONDUCTOR MEMORY DEVICE AND DATA ERASING METHOD THEREFOR

[75] Inventors: Shigeru Atsumi, Tokyo; Masao Kuriyama; Hironori Banba, both of Kawasaki; Akira Umezawa, Yokohama, all of Japan; Nobuaki Otsuka, Menlo Park, Calif.

[73] Assignee: Kabushiki Kaisha Toshiba, Japan

[21] Appl. No.: 507,968

[22] Filed: Jul. 27, 1995

[30] Foreign Application Priority Data

Jul. 28, 1994 [JP] Japan .................................. 6-176726

[51] Int. Cl.$^6$ ................................................. G11C 11/34
[52] U.S. Cl. ................................ 365/185.3; 365/185.22
[58] Field of Search ........................... 365/218, 185.33, 365/185.3, 185.29, 230.03, 210, 185.22, 185.24, 185.18

[56] References Cited

U.S. PATENT DOCUMENTS 5,233,562 8/1993 Ong et al. ............................ 365/218
5,237,535 8/1993 Mielke et al. ......................... 365/218
5,438,544 8/1995 Makino ............................... 365/185.3

*Primary Examiner*—A. Zarabian
*Attorney, Agent, or Firm*—Banner & Allegretti, Ltd.

[57] ABSTRACT

A memory cell array has a plurality of memory cells formed of EEPROM cells arranged in a matrix form. Data in the memory cells is flash-erased, and after this, word lines other than a selected word line are set to a negative potential and erasing verification for detecting an insufficiently erased memory cell is effected. The flash-erasing and erasing verification are repeatedly effected until no insufficiently erased memory cell is detected. When no insufficiently erased memory cell is detected, word lines other than a selected word line are set to a negative potential and an overerased memory cell is detected. When an overerased memory cell is detected, weak program is effected for the cell by applying a voltage lower than the normal writing voltage to the cell.

24 Claims, 6 Drawing Sheets

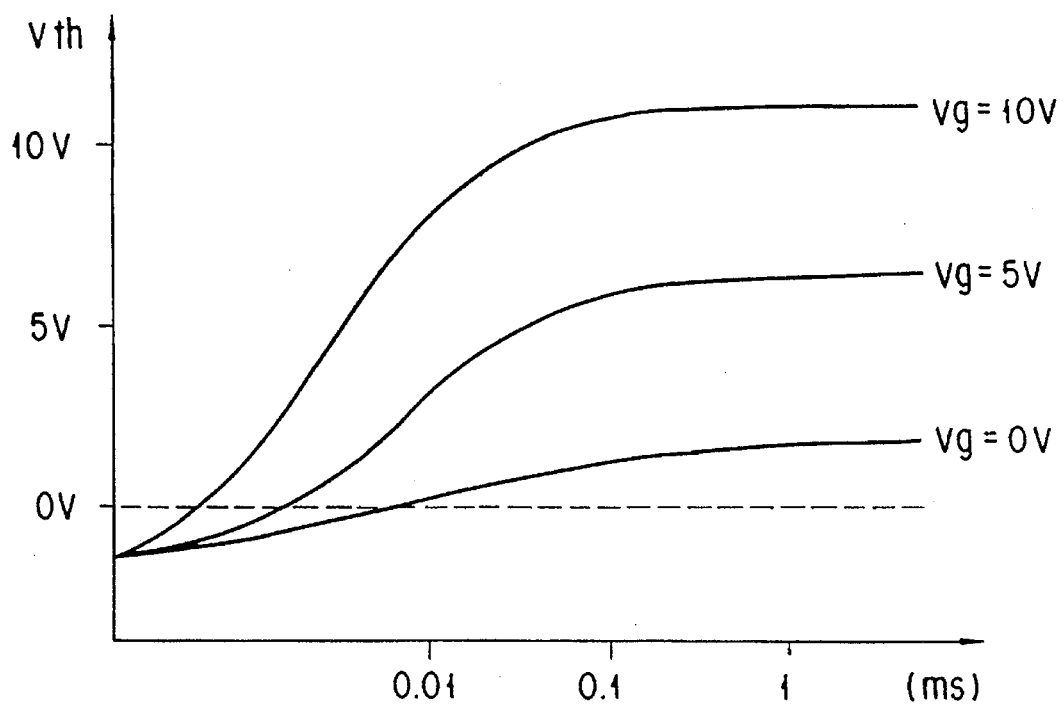
F I G. 14

NON-VOLATILE SEMICONDUCTOR MEMORY DEVICE AND DATA ERASING METHOD THEREFOR

BACKGROUND OF THE INVENTION

1. Field of the Invention

This invention relates to a non-volatile semiconductor memory device capable of electrically flash-erasing data stored in a plurality of memory cells, for example, and a data erasing method therefor.

2. Description of the Related Art

A memory cell constituting a flash EEPROM is constructed by a transistor having a floating gate and a control gate of stacked structure. When data is written into the flash EEPROM, a write voltage is applied between the control gate and the drain to generate hot electrons in the channel and inject the hot electrons into the floating gate. Further, when data stored in the flash EEPROM is erased, for example, a high voltage is applied to the source to generate an intense electric field between the floating gate and the source so as to emit electrons trapped in the floating gate into the source according to the tunnel phenomenon.

The problem occurring at the time of erasing is overerasing which makes the threshold voltage of the memory cell negative. The memory cell which is set in the overerased state (which is hereinafter referred to as an overerased cell) is set in the ON state even in the non-selected state. Therefore, in a case where a cell which stores data "0" and set in the OFF state is connected to a bit line to which the overerased cell is connected, data cannot be correctly read out even if the cell is selected. In order to prevent the overerasing, an erasing method called an intelligent erasing method is used. In the intelligent erasing method, the erasing and verifying operations are repeatedly effected and the erasing operation is terminated when the threshold voltage of the cell whose erasing operation is slowest becomes lower than a desired voltage.

However, the distribution range of the threshold voltage after the erasing in the flash EEPROM is more than 2 V and is larger in comparison with a case of the ultraviolet erasable type in which the distribution of the threshold voltage falls within 1 V. Therefore, the minimum value of the readout voltage is limited and the possibility of lowering the readout voltage is restricted. Further, it is expected that a fluctuation in the manufacturing process will become larger with miniaturization of cells and it becomes necessary to think of a method of reducing a fluctuation in the erasing operation.

In order to narrow the distribution range of the threshold voltage after the erasing, a compaction sequence is proposed by Intel Co. As shown in FIG. 12, in the compaction sequence, overerased cells are detected (S21 to S23) after the erasing. If any overerased cell is detected as the result of this, the compaction for narrowing the distribution range of the threshold voltage is effected (S24). As shown in FIG. 13, the compaction is to effect the weak program in which data rewriting is effected with a gate voltage lower than the normal writing voltage (S31) and then check whether overerased cells are present or not (S32, S33). After the compaction, an address is incremented (S25, S26) and the above operation is effected for all of the cells. According to the compaction sequence, the distribution range of the threshold voltage after the erasing can be narrowed.

FIG. 14 shows the dependency of the writing characteristic in the weak program on the gate voltage. As is clearly understood from FIG. 14, the threshold voltages Vth of the cells after the writing are converged in dependence on the gate voltage Vg at the writing time. Therefore, it becomes possible to effect the rewriting to set the threshold voltage of the overerased cell to a positive value by setting the gate voltage to a low level.

Further, the problem of the conventional flash EEPROM is that a voltage of at least 0 V is applied to the word line in the non-selected state. Therefore, if the overerased cell is connected to a bit line, it is difficult to identify the overerased cell. Therefore, in the conventional method, when the overerased cell connected to the bit line is detected, the weak program is effected for all of the cells connected to the bit line, and then, whether or not the overerased cell is present is verified and the operation is repeatedly effected until no overerased cell is detected.

However, in the conventional method, the following problem occurs.

(1) Since the weak program is also effected for cells of normal threshold voltage other than the overerased cell, the threshold voltage of the normal cell is excessively raised and the cell is set into the insufficiently erased state.

(2) The weak program time of one bit line is necessary for one overerased cell. Therefore, if a large number of overerased cells are present, the rate of the weak program time to the entire erasing time becomes so large and cannot be ignored.

As is understood from the above problem, the conventional method can be applied only when the erasing distribution range is not so largely deviated from a target distribution range. That is, it is based on the assumption that the rate of the overerased cells is extremely small and the threshold voltage of the overerased cell is not set to an excessively large negative value. Therefore, if the voltage at the readout time is kept at the present value of 5 V and the distribution range of the threshold voltage can be made relatively wide, the above conventional method can be satisfactorily used. However, if the power supply voltage is lowered and set to 3 V, for example, it becomes necessary to further lower the upper limit of the threshold voltage after the erasing and it becomes necessary to further narrow the distribution range of the threshold voltage after the compaction. On the assumption that the present distribution immediately after the erasing is used, overerased cells of a number larger than before must be rewritten in order to lower the upper limit of the threshold voltage after the erasing. Therefore, in the conventional method, time required for compaction is made longer and a normal cell other than the overerased cell is set back into the insufficiently erased state, and it is considered that the re-erasing becomes necessary. Therefore, the conventional method has a possibility that the compaction sequence becomes complicated.

SUMMARY OF THE INVENTION

An object of this invention is to provide a non-volatile semiconductor device with which the weak program can be effected with high efficiency in a short time by use of simple sequence and the distribution range of the threshold voltage can be minimized, and a data erasing method therefor.

The above object can be attained by a non-volatile semiconductor device comprising a memory cell array having a plurality of memory cells into which data is electrically written and from which data is erased, the memory cells being arranged in a matrix form and each memory cell being connected to a corresponding row line and a corresponding column line; an erasing circuit for flash-erasing data stored in the plurality of memory cells; a selection circuit for selecting the plurality of memory cells one at a time, the selection circuit setting a selected row line to a positive potential and setting a non-selected row lines to a negative potential; a detection circuit connected to the column line, for detecting a voltage read out from the memory cell selected by the selection circuit, the detection circuit comparing a voltage read out from the memory cell at the time of erasing verification for detecting an insufficiently erased memory cell with a first reference voltage and comparing a voltage read out from the memory cell at the time of overerase verification for detecting an overerased memory cell with a second reference voltage which is lower than the first reference voltage; and a weak program circuit for supplying a voltage lower than the normal writing voltage to the overerased memory cell to raise the threshold voltage thereof by a small amount when the overerased memory cell is detected by the detection circuit.

The data erasing method for the non-volatile semiconductor memory device verifies data of the memory cell one bit at a time after stored data of a plurality of memory cells in the memory cell array is flash-erased. If all of the memory cells in the memory cell array are detected to be set in the erased state as the result of verification, the data is further verified one bit at a time to detect an overerased memory cell. If an overerased memory cell is detected as the result of verification, the weak program for applying a voltage lower than the normal writing voltage to the memory cell to slightly raise the threshold voltage thereof is effected. In this case, it is not necessary to effect the weak program for all of the memory cells that are connected to one bit line. Therefore, the verify and weak program can be efficiently effected in a short time. At each time of the verify and weak program, the selected word line is set at a positive voltage and the non-selected word line is set at a negative voltage. Therefore, the verify and weak program can be effected without giving any influence on the memory cells set in the overerased state and connected to the non-selected word line.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 14 is a diagram for illustrating the principle of the weak program.

DETAILED DESCRIPTION OF THE PREFERRED EMBODIMENTS

There will now be described an embodiment of this invention with reference to the accompanying drawings.

Figure 1:
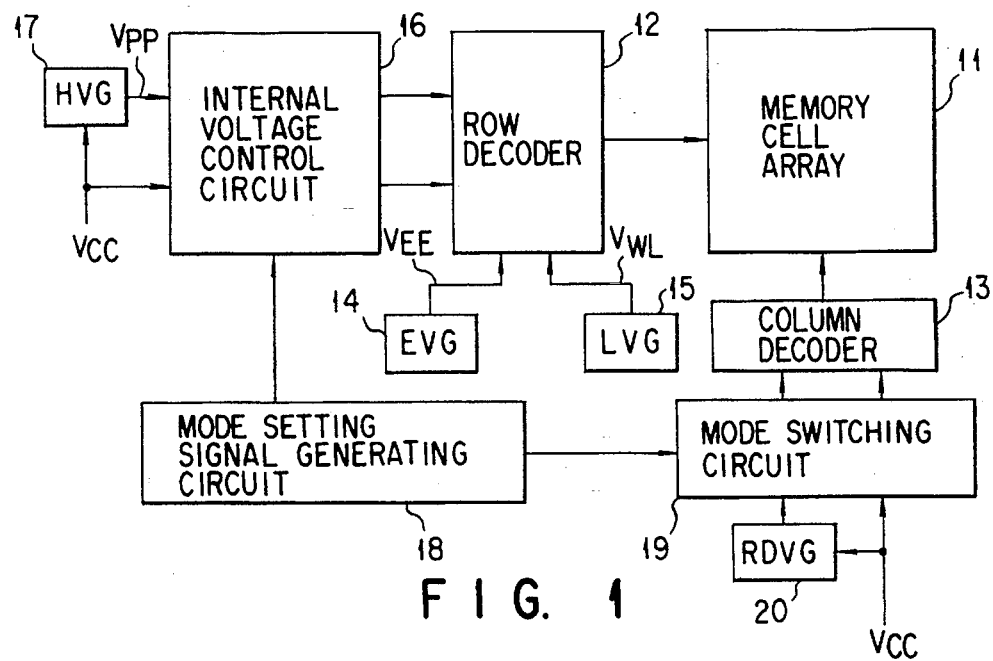
FIG. 1 is a construction diagram showing a first embodiment of this invention.

FIG. 1 schematically shows a non-volatile semiconductor memory device of this invention. As shown in FIG. 1, in a memory cell array 11, EEPROM cells of stacked gate structure (not shown) as memory cells are arranged in a matrix form of rows and columns. Data of the memory cells in the memory cell array 11 are flash-erased or simultaneously erased. A row decoder 12 and a column decoder 13 for selecting a memory cell according to an address signal are connected to the memory cell array 11. An erasing voltage generator (EVG) 14 for generating a negative voltage $V_{EE}$, a low voltage generator (LVG) 15 for generating a voltage $V_{WL}$ lower than the power supply voltage, and an internal voltage control circuit 16 are connected to the row decoder 12. The internal voltage control circuit 16 is supplied with a writing high voltage $V_{pp}$ generated by a high voltage generation circuit (HVG) 17 and a power supply voltage Vcc and is connected to a mode setting signal generating circuit 18. The mode setting signal generating circuit 18 generates a mode setting signal for setting a data writing mode, an erasing mode, an erasing verify mode for verifying a threshold voltage after data erasing, an overerase verify mode, a weak program mode and the like. The internal voltage control circuit 16 switches a voltage to be supplied to the row decoder 12 according to the mode setting signal from the mode setting signal generating circuit 18. Further, the internal voltage control circuit 16 includes a voltage generating circuit as will be described later and the voltage generating circuit creates a voltage lower than the normal writing voltage at the time of weak program mode and supplies the same to the row decoder 12.

A mode switching circuit 19 is connected to the column decoder 13. The mode switching circuit 19 is supplied with a readout voltage generated by a readout voltage generating circuit (RDVG) 20 and the power supply voltage Vcc and is connected to the mode setting signal generating circuit 18. The mode switching circuit 19 switches a voltage to be supplied to the column decoder 13 according to a mode setting signal supplied from the mode setting signal generating circuit 18.

Figure 2:
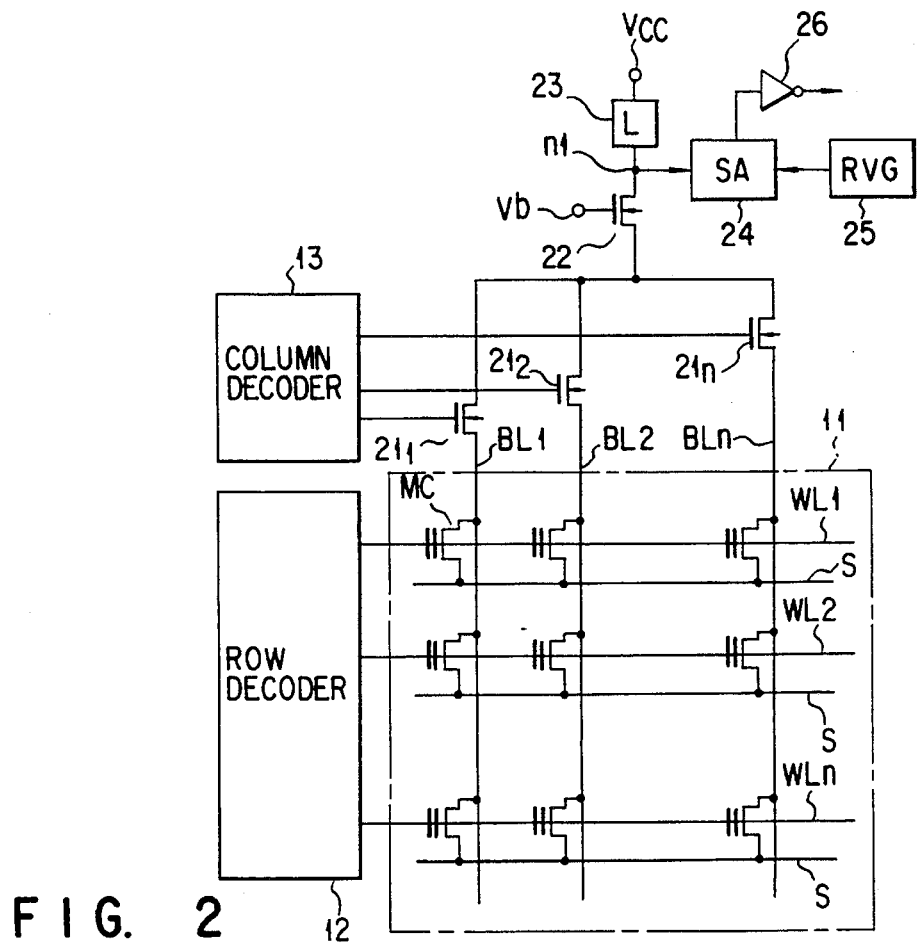
FIG. 2 is a circuit diagram concretely showing part of FIG. 1.

FIG. 2 concretely shows part of FIG. 1. In the memory cell array 11, a plurality of memory cells MC each formed of an EEPROM cell are arranged in a matrix form. Word lines (row lines) WL1, WL2 to WLn connected to the row decoder 12 are arranged on the respective rows, and bit lines (column lines) BL1, BL2 to BLn are arranged on the respective columns. The control gates of a plurality of memory cells MC arranged on the same row are connected to the word line arranged on the row, and the sources thereof are commonly connected to a source line S. Further, the drains of a plurality of memory cells MC arranged on the same column are connected to the bit line arranged on the column. The bit lines BL1, BL2 to BLn are respectively connected to the sources of N-channel transistors $21_1$, $21_2$ to $21_n$. The gates of the transistors $21_1$, $21_2$ to $21_n$ are connected to the column decoder 13 and the drains thereof are connected to the source of an N-channel transistor 22. A bias voltage Vb is supplied to the gate of the transistor 22 and the drain thereof is connected to the power supply Vcc via a load (L) 23. A connection node n1 between the drain of the transistor 22 and the load 23 is connected to one of the input terminals of a sense amplifier 24. The other input terminal of the sense amplifier 24 is connected to a reference voltage generating circuit (RVG) 25 for generating a reference voltage and the output terminal thereof is connected to an inverter circuit 26.

Figure 3:
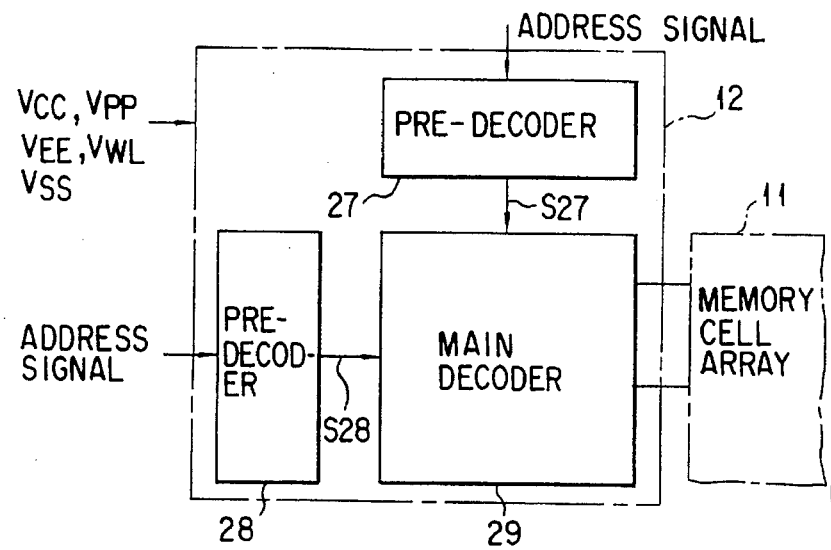
FIG. 3 is a construction diagram concretely showing part of FIG. 1.

FIG. 3 shows the row decoder 12. The row decoder 12 is constructed by pre-decoders 27, 28 and main decoder 29. The pre-decoders 27, 28 decode address signals and output signals of the pre-decoder 27, 28 are supplied to the main decoder 29. As described before, the row decoder 12 is supplied with an erasing negative Voltage $V_{EE}$ of approx. −10 V, for example, a writing high voltage Vpp of approx. 12 V, for example, a voltage $V_{WL}$ of 3 V, for example, supplied to the gate of a memory cell which is not selected at the time of erasing mode, and a ground voltage $V_{SS}$ of 0 V in addition to the power supply voltage Vcc of 5 V, for example.

Figure 4:
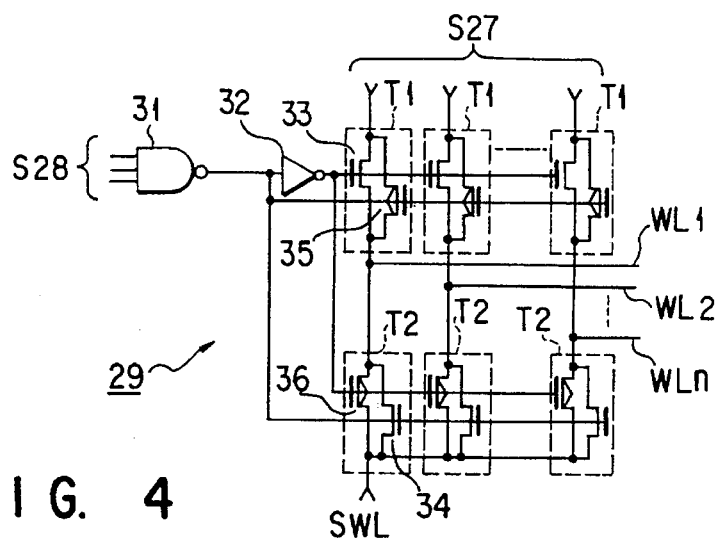
FIG. 4 is a circuit diagram concretely showing part of FIG. 3.

FIG. 4 shows the main decoder 29. The main decoder 29 includes a CMOS NAND circuit 31 supplied with a decode output signal $S_{28}$ of the pre-decoder 28, a CMOS inverter circuit 32 for inverting the output signal of the NAND circuit 31, and transfer gates T1, T2 connected to the respective word lines WL1 to WLn with two of them set as one pair. The transfer gates T1, T2 output an output signal $S_{27}$ from the pre-decoder 27 or a voltage of the internal power supply SWL to a corresponding word line according to an output signal of the NAND gate 31.

Each of the transfer gates T1 is constructed by an N-channel MOS transistor 33 and a P-channel MOS transistor 35 which are connected in parallel, the gate of each N-channel MOS transistor 33 is connected to the output terminal of the inverter circuit 32, and the gate of each P-channel MOS transistor 35 is connected to the output terminal of the NAND circuit 31. Each of the transfer gates T1 is supplied with an output signal $S_{27}$ of the pre-decoder 27 at one end thereof and connected to a corresponding one of the word lines WL1 to WLn at the other end thereof.

Each of the transfer gates T2 is constructed by an N-channel MOS transistor 34 and a P-channel MOS transistor 36 which are connected in parallel, the gate of each P-channel MOS transistor 36 is connected to the output terminal of the inverter circuit 32, and the gate of each N-channel MOS transistor 34 is connected to the output terminal of the NAND circuit 31. Each of the transfer gates T2 is supplied with a voltage of the internal power supply SWL at one end thereof and connected to a corresponding one of the word lines WL1 to WLn at the other end thereof.

The decode output signal $S_{27}$ of the pre-decoder 27 is set to a power supply voltage Vcc when selecting a word line at the readout time, and set to a high voltage Vpp when selecting a word line in the write mode. Further, it is set to 0 V when no word line is selected. On the other hand, it is set to a voltage $V_{EE}$ when selecting a word line in the erasing mode and set to a voltage $V_{WL}$ when no word line is selected. The voltage of the power supply SWL is set to a voltage $V_{WL}$ in the erasing mode and set to 0 V in a mode other than the erasing mode.

In the above memory cell array 11, in the readout mode, the power supply voltage Vcc (5 V) is applied to the selected word line and a readout voltage of, for example, approx. 1 V generated from the readout voltage generating circuit 20 is applied to the selected bit line. In the write mode, the writing high voltage Vpp (12 V) is applied to the selected word line and the high voltage is applied to the selected bit line. Further, in the erasing mode, for example, the power supply voltage Vcc is applied to all of the source lines S, a negative voltage $V_{EE}$ is applied only to a selected word line and a voltage $V_{WL}$ of 3 V is applied to all of the non-selected word lines. In this state, all of the bit lines are set in the electrically floating state, for example.

Figure 5:
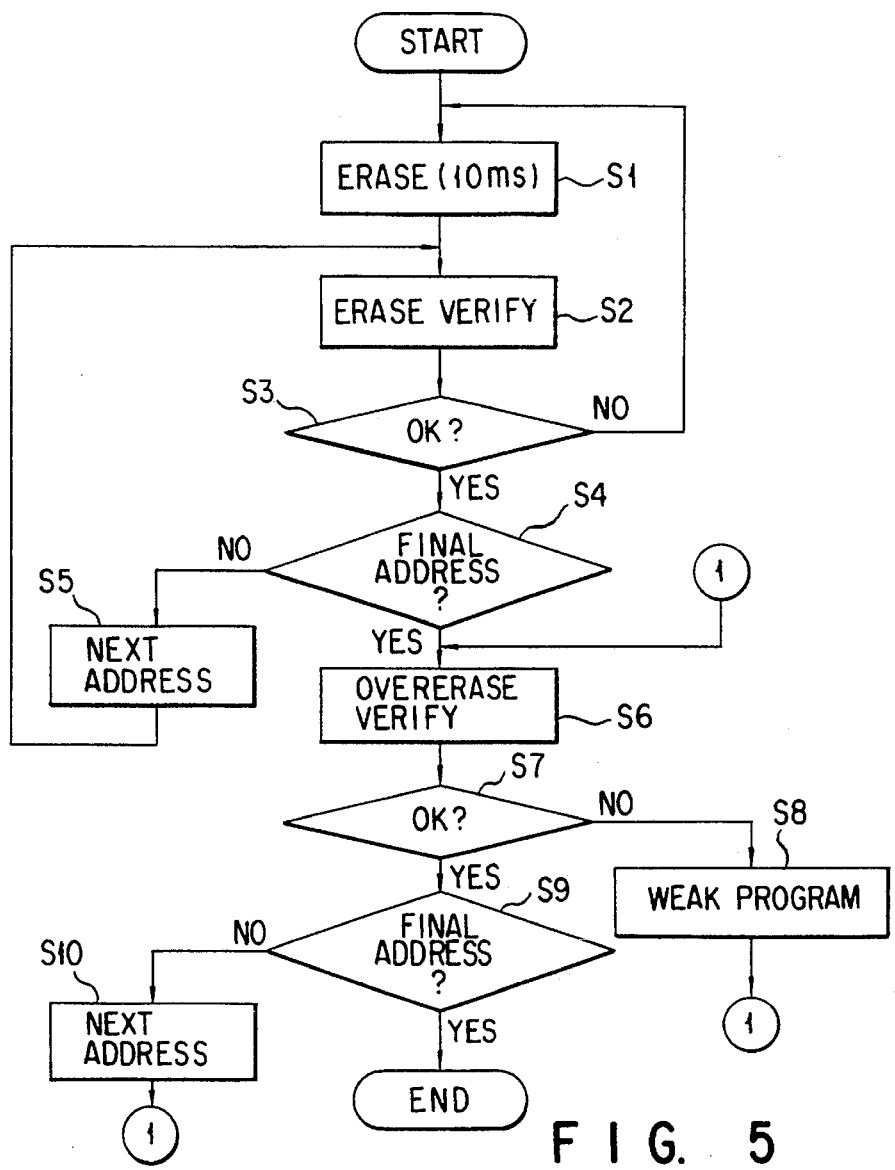
FIG. 5 is a flowchart showing an erasing sequence according to this invention.

FIG. 5 shows an erasing sequence according to this invention. First, when the automatic erasing is started, a bias voltage of the erasing state described above is applied to the memory cell for 10 ms, for example, and a plurality of memory cells are subjected to the flash-erasing process (S1). In this invention, no writing is effected before erasing. In this respect, this invention is significantly different from the conventional method in which the writing is effected before erasing. The reason why no writing is effected before erasing is that data for the cells is not prepared before erasing and an increase in the distribution range after erasing can be reduced by the weak program after the erasing.

After the erasing is completed, memory cells are sequentially selected by the row decoder 12 and column decoder 13 to verify each bit (S2). At this time, a non-selected word line is biased to a negative potential. As a result, even if an overerased cell is present in a plurality of cells connected to the same bit line, the threshold voltage of a selected cell can be precisely monitored. That is, the influence by the non-selected cell can be eliminated, and therefore, the overerased cell can be correctly recognized. If an insufficiently erased cell is detected as the result of verification, the erasing is effected again. The repeated operation of verification and erasing is continued until data of all of the cells is sufficiently erased (S1 to S5).

When it is detected that data of all cells is sufficiently erased, the compaction sequence is started. In the compaction sequence, first, verification of an overerased cell is effected. That is, bits are verified one at a time to determine an overerased cell (S6, S7). In the verification of an overerased cell, a non-selected word line is biased to a negative potential as described before, and even if an overerased cell is present in the non-selected cells, an influence by the overerased cell is prevented. If an overerased cell is detected as the result of verification, the weak program is effected (S8). That is, in the weak program, a voltage of, for example, 5 V which is lower than the normal writing voltage is applied to a selected word line, a negative voltage is applied to a non-selected word line, and a writing voltage or a voltage approximately equal thereto is applied to a selected bit line. In this voltage relation, any voltage can be used if it causes channel hot electrons to be generated and injected into the floating gate. The selected cell is gradually programmed according to the writing characteristic shown in FIG. 14 and the threshold voltage thereof rises.

After completion of the weak program, verification for overerased cells is effected again (S6, S7), and if the overerased state is still present, the weak program and verification are effected (S6 to S8) until the overerased state disappears. On the other hand, if the overerased state is not present, the address is incremented and verification for a cell designated by the next address is effected (S9, S10). It is possible tolimit the number of operations of the weak program and verification repeatedly effected and determine that a cell is defective if the overerased state for the cell is kept unchanged before the number of operations reaches the upper limit. When the above operation is effected to the final address, the compaction is completed.

Further, it is possible to effect the erasing verify mode again after the weak program sequence is completed. This is to detect an excessively written cell whose threshold voltage is made excessively high by the weak program.

Figure 6:
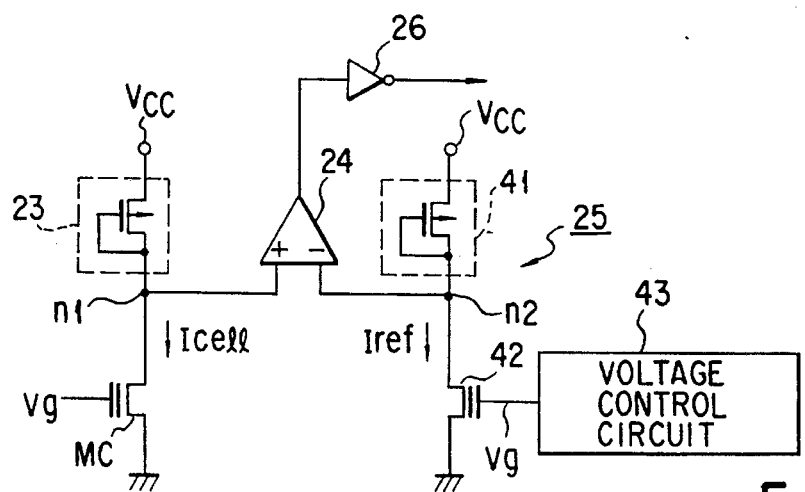
FIG. 6 is a circuit diagram showing an example of a sense amplifier circuit shown in FIG. 2.

FIG. 6 shows a sense amplifier circuit applied to this invention and portions which are the same as those of FIG. 2 are denoted by the same reference numerals. The non-inverting input terminal of a sense amplifier 24 constructed by a differential amplifier is connected to the connection node nl. For example, a reference voltage generating circuit 25 includes a load 41 which is similar to the load 23, a reference cell 42 having the same structure as the memory cell MC, and a voltage control circuit 43 connected to the control gate of the reference cell 42. The inverting input terminal of the sense amplifier 24 is connected to a connection node n2 between the load 41 and the reference cell 42. The load 41 is constructed by a P-channel transistor whose mutual conductance gm is set to a value which is, for example, m (m≧1) times the mutual conductance of a P-channel transistor constructing the load 23. The voltage control circuit 43 is connected to the control gate of the reference cell 42 and generates a voltage Vg.

The sense amplifier circuit with the above construction is explained. Since the relation between the mutual conductances of the load 23 and the load 41 is set as described above, the potential of the inverting input terminal of the sense amplifier 24, that is, the reference potential is equivalent to a value obtained when a cell current Icell flowing in the memory cell MC becomes 1/m times a reference current Iref flowing in the reference cell 42.

Figure 7:
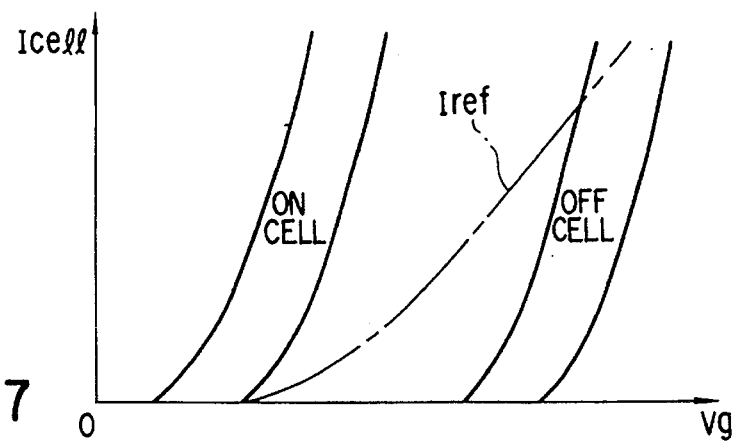
FIG. 7 is a diagram for illustrating the operation of a circuit shown in FIG. 6.

FIG. 7 shows the operation of the sense amplifier circuit, and as shown in FIG. 7, a cell in the erased state (ON cell) and a cell in the written state (OFF cell) respectively have preset threshold distributions. Setting of the mutual conductance gm of the load 41 on the reference side to m times the mutual conductance of the load 23 is equivalent to setting of the inclination of the reference current Iref to 1/m times the original inclination. The sense amplifier 24 compares the cell current Icell of the selected cell with the reference current Iref, and determines that the selected cell is set in the ON state if Icell>Iref and the selected cell is set in the OFF state if Icell<Iref. As is clearly seen from FIG. 7, it becomes more difficult to determine the OFF cell as the gate voltage becomes higher and it becomes more difficult to determine the ON cell as the gate voltage becomes lower.

The characteristic of the reference current Iref shown in FIG. 7 can be set without changing the mutual conductances gm of the loads 23, 41. For example, the mutual conductance gm of the reference cell 42 may be set to 1/m times the mutual conductance gm of the memory cell. In order to attain this, the following methods are considered.

(1) A method of setting the channel length of the reference cell 42 to m times that of the memory cell.

(2) A method of setting the channel width of the reference cell 42 to 1/m times that of the memory cell.

(3) A combination of the above methods (1) and (2).

(4) A method of connecting m transistors with the same structure in series.

Figure 8:
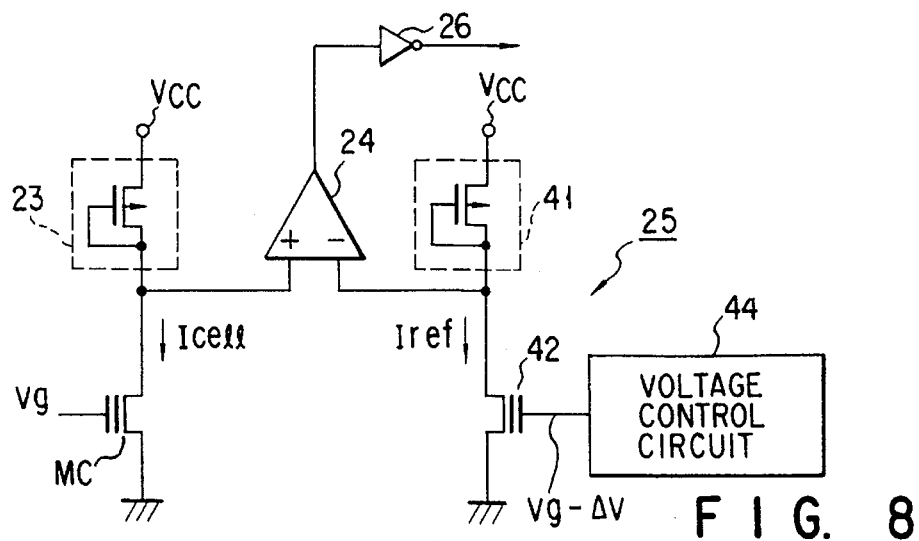
FIG. 8 is a circuit diagram showing another example of a sense amplifier circuit shown in FIG. 2.

FIG. 8 shows a modification of the sense amplifier circuit shown in FIG. 6. In the case of FIG. 6, the voltage control circuit 43 generates a voltage Vg, but in the case of FIG. 8, the mutual conductances gm of the loads 23, 41 are set equal to each other and the voltage control circuit 44 generates a voltage (Vg–ΔV). That is, the voltage control circuit 44 generates a voltage which is lower than the voltage Vg of the memory cell MC by ΔV. In this case, as shown in FIG. 9, the reference current is set to a state corresponding to a voltage higher than the threshold voltage of the reference cell 42 by ΔV.

Figure 9:
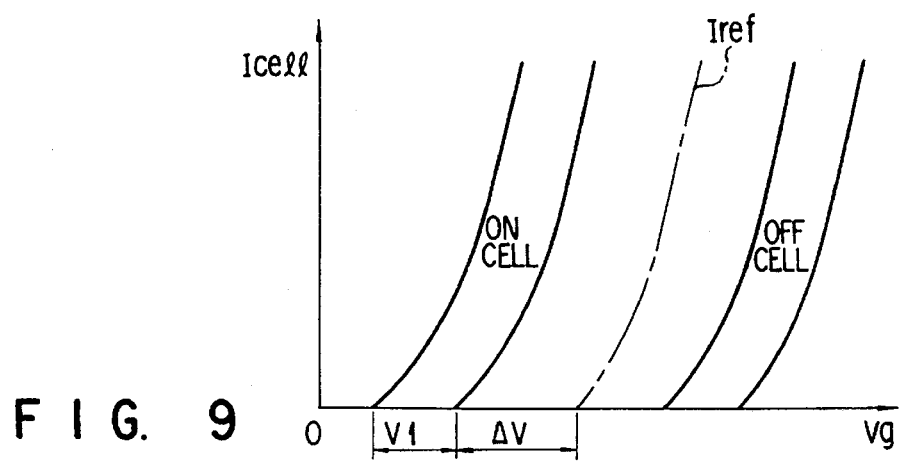
FIG. 9 is a diagram for illustrating the operation of a circuit shown in FIG. 8.

Setting of the reference current as shown in FIG. 9 can be attained without changing the voltages applied to the reference cell 42 and the control gate of the memory cell MC. That is, it is satisfactory if means capable of raising the threshold voltage ΔV of the reference cell 42 without changing the inclination of the reference current can be used. In order to attain this, the following methods are considered.

(1) A method of lightly writing data into the reference cell 42 to raise the threshold voltage from the inherent threshold voltage by ΔV.

(2) A method of setting the reference cell 42 into the erased state and lowering the upper limit of the threshold voltages of the memory cells in the erased state to a voltage which is lower than the threshold voltage of the reference cell 42 by ΔV.

(3) A combination of the methods (1) and (2).

Further, it is possible to use a combination of the sense amplifiers shown in FIGS. 6 and 8. That is, it is possible to construct a sense amplifier circuit in which the mutual conductances of the loads are changed and a voltage applied to the control gate of the reference cell is changed.

Various verifications for realizing the sequence of FIG. 5 can be realized by use of the sense amplifier circuit shown in FIGS. 6 and 8.

In the erasing verification, the sense amplifier circuit shown in FIG. 8 is effective. That is, in the erasing verification, the reference current Iref may be set to the same value as the cell current Icell corresponding to the upper limit of the threshold voltage distribution of the ON cell in FIG. 9. More specifically, in the sense amplifier circuit shown in FIG. 8, if ΔV=0 in a voltage (Vg–ΔV) output from the voltage control circuit 44, the threshold voltage of the reference cell is set to a voltage slightly higher than the upper limit of the threshold voltage distribution of the ON cell.

In a case where the sense amplifier circuit shown in FIG. 6 is used, the upper limit of the threshold voltage distribution of the ON cell can be set equal to or lower than the voltage of the word line at the verify time by setting the output voltage Vg of the voltage control circuit 43 to, for example, 3 V which is lower than the normal voltage.

On the other hand, for overerase verification, either the sense amplifier circuit of FIG. 6 or that shown in FIG. 8 is effective. In a case where the sense amplifier circuit shown in FIG. 8 is used for overerase verification, the reference current is set to correspond to the lower limit of the threshold distribution of the ON cell after compaction. That is, in comparison with a case of erasing verification, the voltage control circuit 44 sets ΔV to a slightly higher voltage V1.

When the sense amplifier circuit shown in FIG. 8 is operated according to the sequence shown in FIG. 5, first, ΔV in the voltage (Vg–ΔV) output from the voltage control circuit 44 is set to 0 V. In this state, the upper limit of the threshold distribution of the ON cell is determined by the erasing verification. After this, ΔV in the voltage (Vg−ΔV) output from the voltage control circuit 44 is set to a slightly higher voltage V1. In this state, the overerase verification is effected to determine a memory cell whose threshold voltage is lower than the threshold voltage at the time of erasing verification is a cell set in the overerased state and the weak program is effected for the cell. By effecting this sequence, the distribution range of the threshold voltage is set within the voltage of 1 V after compaction.

Further, when the sense amplifier circuit shown in FIG. 6 is operated according to the sequence shown in FIG. 5, gm of the transistor constructing the load 41 may be set to, for example, m (m<1) times gm of the transistor constructing the load 23. With this construction, the reference current Iref becomes larger than the cell current Icell. Therefore, the lower limit of the threshold voltage distribution of the ON cell is verified to be slightly lower than the threshold voltage of the reference cell.

Further, it is possible to set the rate m of gm such that m≦1. That is, it is satisfactory if the reference current Iref can be increased. In this case, the inclination of the reference current Iref becomes steeper than that of the cell current Icell. In order to attain this, a method of increasing the number of reference cells at the time of overerase verification or switching the transistor to a transistor having a larger channel width may be considered.

Figure 10:
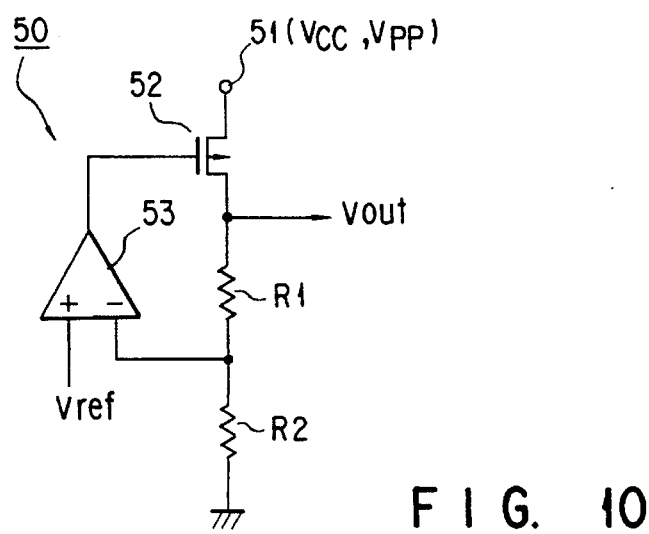
FIG. 10 is a circuit diagram showing a voltage generation circuit applied to this invention.

FIG. 10 shows a voltage generating circuit 50 which is applied to the voltage control circuit 43, 44, for example. As shown in FIG. 10, a P-channel transistor 52 and resistors R1, R2 are connected between a power supply terminal 51 to which a power supply voltage Vcc is applied and the ground terminal. A connection node between the resistors R1 and R2 is connected to an inverting input terminal of a differential amplifier 53. The non-inverting input terminal of the differential amplifier 53 is supplied with a reference voltage Vref and the output terminal thereof is connected to the gate of the transistor 52. A voltage Vout is output from a connection node between the drain of the transistor 52 and the resistor R1. With this connection, the output voltage Vout can be expressed by the following equation.

$$Vout = Vref \times (R1+R2)/R2$$

The above voltage used for erasing verification and overerase verification can be generated by changing, for example, the reference voltage Vref according to the sequence shown in FIG. 5.

Further, when the voltage generating circuit 50 shown in FIG. 10 is applied to the internal voltage control circuit 16 shown in FIG. 1, a high voltage Vpp for writing is applied to the power supply terminal 51 and a voltage lower than the voltage obtained in the normal writing mode can be generated by adequately setting the reference voltage Vref according to the weak program.

In the sequence shown in FIG. 5, it is preferable that the voltage of the word line at the time of overerase verification and the voltage of the word line at the time of weak program are set equal to each other. The reason is that it is necessary to drive a large capacity when the voltage of the word line is changed, it takes a long time for the voltage to become stable and time for the whole sequence is largely influenced.

Figure 11:
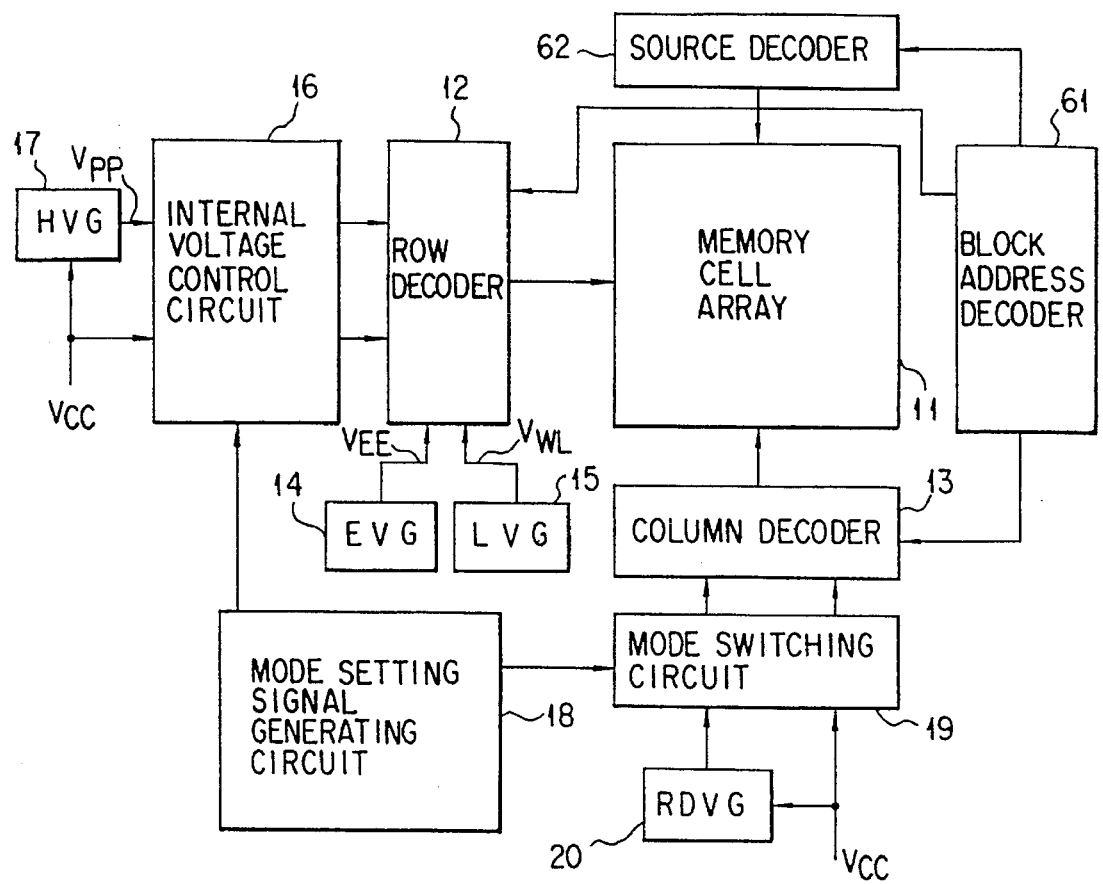
FIG. 11 is a construction diagram showing a second embodiment of this invention.
Figure 12:
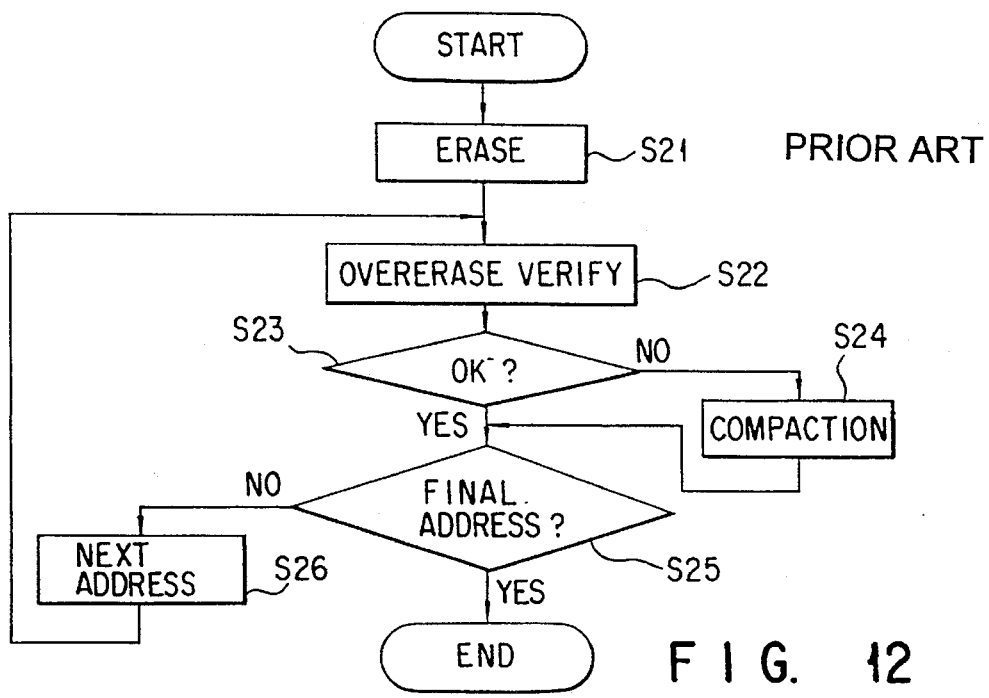
FIG. 12 is a flowchart showing the conventional compaction sequence.
Figure 13:
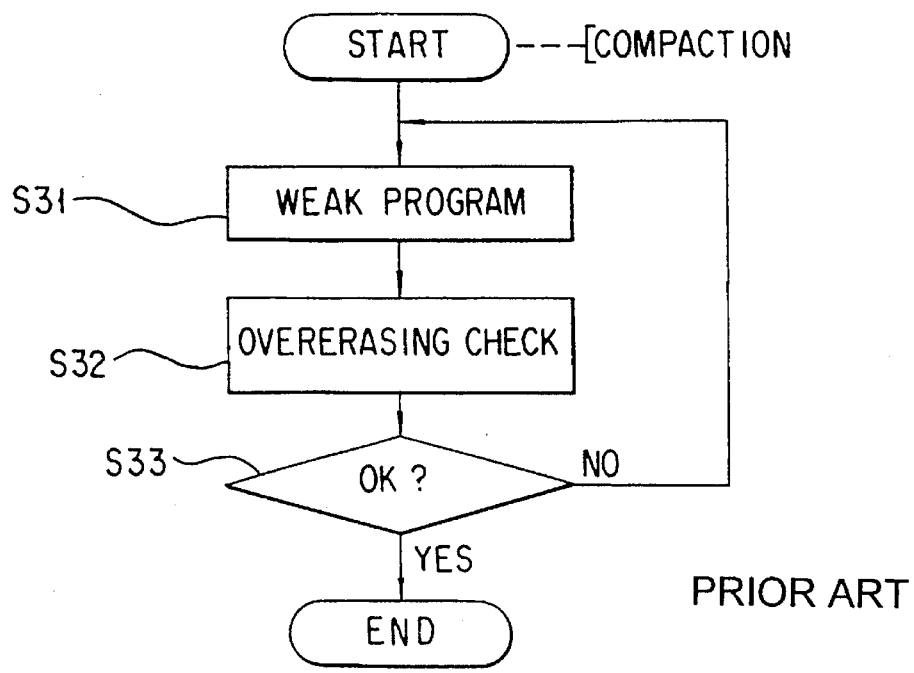
FIG. 13 is a flowchart concretely showing the compaction of FIG. 12.

FIG. 11 shows a second embodiment of this invention and portions which are the same as those of FIG. 1 are denoted by the same reference numerals and the explanation is made only for different portions. In this embodiment, a memory cell array 11 is divided into a plurality of blocks and data stored in each block is flash-erased. A block decoder 61 outputs a block selection signal for selecting one block according to an address signal. The block selection signal from the block decoder 61 is supplied to the row decoder 12, column decoder 13 and source decoder 62 for selecting a source line. As described before, data in a plurality of memory cells of one block selected by the row decoder 12, column decoder 13 and source decoder 62 is flash-erased, and after this, the erasing verification, overerase verification and weak program are executed according to the erasing sequence shown in FIG. 5.

What is claimed is:

1. A non-volatile semiconductor device comprising:

a memory cell array having a plurality of memory cells into which data is electrically written and from which data is erased, said memory cells being arranged in a matrix form and each memory cell being connected to a corresponding one of row lines and a corresponding one of column lines;

an erasing circuit for flash-erasing data stored in said plurality of memory cells;

a selection circuit for selecting one of said memory cells, said selection circuit setting a selected row line to a positive potential and setting non-selected row lines to negative potentials in an overeasing verification mode for detecting an overerased memory cell and a weak program mode for weak programming said overerased memory cell;

a detection circuit connected to the column lines, for detecting a voltage read out from the memory cell selected by said selection circuit, said detection circuit comparing a voltage read out from the memory cell with a first reference voltage in an erasing verification mode and comparing a voltage read out from the memory cell with a second reference voltage in said overerasing verification mode; and a weak program circuit for supplying a voltage lower than a normal writing voltage to the overerased memory cell to raise a threshold voltage thereof by a small amount when the overerased memory cell is detected by said detection circuit.

2. A device according to claim 1, wherein said erasing circuit flash-erases data in a plurality of memory cells when an insufficiently erased memory cell is detected by said detection circuit.

3. A device according to claim 1, wherein the first reference voltage is a voltage which is slightly higher than an upper limit of a threshold voltage of said memory cells in the erased state and the second reference voltage is a voltage which is substantially equal to a lower limit of the threshold voltage of said memory cells in the erased state.

4. A device according to claim 1, wherein said detection circuit includes:

a voltage generating circuit for generating a first voltage at a time of erasing verification and a second voltage different from the first voltage at a time of overerasing verification;

a reference cell whose gate is supplied with one of the first and second voltages generated from said voltage generating circuit, said reference cell generating a reference current according to one of the first and second voltages supplied thereto;

a first load circuit for generating one of the first and second reference voltages according to the reference current;

a second load circuit for generating a voltage corresponding to a cell current flowing in said memory cell, the cell current being set to 1/m (m>1) times the reference current; and a differential amplifier connected to said first and second load circuits, for comparing one of the first and second voltages with a voltage generated by said second load circuit.

5. A device according to claim 4, wherein said first load circuit is constructed by a first transistor, said second load circuit is constructed by a second transistor, and a mutual conductance of said first transistor is set to m times that of said second transistor.

6. A device according to claim 4, wherein a mutual conductance of a transistor constructing said reference cell is set smaller than that of said memory cell.

7. A device according to claim 4, wherein a channel length of a transistor constructing said reference cell is set larger than that of a transistor constructing said memory cell.

8. A device according to claim 4, wherein a channel width of a transistor constructing said reference cell is set larger than that of a transistor constructing said memory cell.

9. A device according to claim 1, wherein said detection circuit includes:

a voltage generating circuit for generating a first voltage when erasing verification is effected by said detection circuit and generating a second voltage different from the first voltage when overerasing verification is effected by said detection circuit;

a reference cell supplied with one of the first and second voltages generated from said voltage generating circuit at a gate thereof, for generating a reference current according to one of the first and second voltages supplied thereto;

a first load circuit connected to said reference cell, for generating one of the first and second reference voltages according to the reference current;

a second load circuit for generating a voltage corresponding to a cell current flowing in said memory cell; and a differential amplifier connected to said first and second load circuits, for comparing one of the first and second voltages with a voltage generated by said second load circuit.

10. A device according to claim 9, wherein said voltage generating circuit generates a third voltage which is slightly higher than an upper limit of a threshold voltage of said memory cells in the erased state and supplies the third voltage to the gate of said reference cell when erasing verification is effected by said detection circuit and generates a fourth voltage which is substantially equal to a lower limit of the threshold voltage of said memory cells in the erased state and supplies the fourth voltage to the gate of said reference cell when overerasing verification is effected by said detection circuit.

11. A device according to claim 9, wherein said voltage generating circuit includes:

a transistor whose current path is connected between a first power supply and an output terminal;

first and second resistors series-connected between said output terminal and a second power supply; and a differential amplifier having a first input terminal connected to a connection node between said first and second resistors, a second input terminal supplied with a reference voltage and an output terminal connected to a gate of said transistor, the reference voltage being set to a first voltage when erasing verification is effected by said detection circuit and set to a second voltage different from the first voltage when overerasing verification is effected by said detection circuit.

12. A device according to claim 9, wherein said first load circuit is constructed by a first transistor, said second load circuit is constructed by a second transistor, and mutual conductances of said first and second transistors are set equal to each other.

13. A device according to claim 1, wherein said selection circuit sets a selected row line to a positive voltage and sets a non-selected row line to a negative voltage at a time of weak program and overerasing verification by said detection circuit.

14. A device according to claim 1, wherein said memory cell array is divided into a plurality of blocks.

15. A device according to claim 14, further comprising a block selecting circuit for selecting one of said plurality of blocks, said block selecting circuit being connected to said selection circuit.

16. An erasing method for a non-volatile semiconductor device including a memory cell array having a plurality of electrically programmable and erasable memory cells arranged in a matrix form, comprising:

a first step of flash-erasing data stored in said plurality of memory cells, and then, verifying the data of said memory cells one at a time and repeatedly effecting the flash-erasing operation until all of said memory cells are set into an erased state;

a second step of setting a selected row line to a positive voltage, setting a non-selected row line to a negative voltage, and detecting an overerased memory cell for each bit when all of said memory cells are set into the erased state; and a third step of slightly raising the threshold voltage of an overerased memory cell by applying a voltage lower than the normal writing voltage to the overerased memory cell when the overerased memory cell is detected.

17. A method according to claim 16, wherein the selected row line is set to a positive voltage and the non-selected row line is set to a negative voltage in said first step.

18. A method according to claim 16, wherein a reference voltage for detection is set slightly higher than an upper limit of a threshold voltage of the memory cells in the erased state in said first step.

19. A method according to claim 16, wherein a reference voltage for detection is set substantially equal to a lower limit of a threshold voltage of the memory cells in the erased state in said second step.

20. A method according to claim 16, wherein the non-selected row line is set to a negative voltage in said third step.

21. An erasing method for a non-volatile semiconductor device including a memory cell array having a plurality of electrically programmable and erasable memory cells arranged in a matrix form, comprising the steps of:

flash-erasing data stored in said plurality of memory cells;

setting a selected row line to a positive voltage and setting a non-selected row line to a negative voltage after the flash-erasing, and reading data of said memory cells for each bit to detect an insufficiently erased memory cell;

effecting the flash-erasing process again when an insufficiently erased memory cell is detected in said detection step;

setting a selected row line to a positive voltage and setting a non-selected row line to a negative voltage when all of said memory cells are set into an erased state, and detecting an overerased memory cell for each bit; and setting a selected row line to a positive voltage, setting a non-selected row line to a negative voltage, and applying a voltage lower than the normal writing voltage to an overerased memory cell to slightly raise the threshold voltage of the overerased memory cell when the overerased memory cell is detected.

22. A method according to claim 21, wherein a reference voltage for detection is set slightly higher than an upper limit of a threshold voltage of the memory cells in the erased state when the insufficiently erased memory cell is detected.

23. A method according to claim 21, wherein a reference voltage for detection is set substantially equal to a lower limit of a threshold voltage of the memory cells in the erased state when the overerased memory cell is detected.

24. A non-volatile semiconductor device comprising:

a memory cell army having a plurality of memory cells into which data is electrically written and from which data is erased, said memory cells being arranged in a matrix form and each memory cell being connected to a corresponding one of row lines and a corresponding one of column lines;

an erasing circuit for flash-erasing data stored in said plurality of memory cells;

a row decoder having an N-channel transistor, for selecting one of said memory cells, said row decoder setting a selected row line to a positive potential and setting non-selected row lines to negative potentials through said N-channel transistor during an overerasing verification mode for detecting an overerased memory cell and a weak program mode for weak programming said overerased memory cell;

a sense amplifier connected to the column line, for detecting a voltage read out from the memory cell selected by said row decoder, said sense amplifier comparing a voltage read out from the memory cell with a reference voltage during said overerasing verification mode; and a weak program circuit for supplying a voltage lower than a normal writing voltage to the overerased memory cell to raise a threshold voltage thereof by a small amount when the overerased memory cell is detected by said detection circuit.

\* \* \* \* \*